United States Patent [19]

Sutherland et al.

[11] 3,818,119

[45] June 18, 1974

[54] MINIATURE POWER BUS FOR PRINTED CIRCUIT BOARDS

[75] Inventors: James F. Sutherland, Pittsburgh; Earl T. Farley, Glenshaw, both of Pa.

[73] Assignee: Westinghouse Electric Corporation, Pittsburgh, Pa.

[22] Filed: June 23, 1972

[21] Appl. No.: 265,905

[52] U.S. Cl. .................. 174/72 B, 29/624, 156/51, 174/117 FF, 317/261

[51] Int. Cl. ..... H02g 5/00, H01b 7/08, H01b 13/00

[58] Field of Search ....... 174/72 B, 117 FF; 29/624; 156/47, 51, 52; 317/261

[56] References Cited

UNITED STATES PATENTS

| | | | |
|---|---|---|---|
| 1,999,137 | 4/1935 | Flewelling | 174/72 B X |
| 3,708,609 | 1/1973 | Iosue et al. | 174/72 B |

FOREIGN PATENTS OR APPLICATIONS

| | | | |
|---|---|---|---|
| 378,125 | 8/1932 | Great Britain | 317/261 |
| 595,657 | 12/1947 | Great Britain | 317/261 |

*Primary Examiner*—Laramie E. Askin

*Attorney, Agent, or Firm*—E. F. Possessky

[57] ABSTRACT

An improved miniaturized electrical bus conductor is detailed comprising laminated thin parallel conductor strips which are separated and encapsulated by insulating material. The structure of the conductive strips is such that at spaced positions along the length of the bus conductor there is a non-overlapping relationship across the full width of the bus conductor so that the electrical bus conductor can be cut to a desired length at these non-overlapping positions without shorting the conductor strips.

4 Claims, 6 Drawing Figures

MINIATURE POWER BUS FOR PRINTED CIRCUIT BOARDS

BACKGROUND OF THE INVENTION

1. Field of the Invention

The present invention relates to providing an improved miniaturized electrical bus conductor for use with printed circuit board components.

2. Prior Art

The typical printed circuit board has a plurality of symmetrically spaced apertures therethrough to serve as electrical connection positions, or the board has a plurality of symmetrically positioned wiring posts. The electrical network is etched on the surface of the printed circuit board and connects the various electrical components of the system. The wiring of the basic electrical power bus on such printed circuit boards presents some problems. If the power bus is etched with the other conductors on the face of the printed circuit board, the use of the board's surface is limited by the inability to cross the power bus with other conductive leads.

The use of integrated circuit electrical component packages which are mounted on the printed circuit board increases the desirability of providing a miniaturized and convenient power bus on the printed circuit board. A miniature thin parallel plate electrical bus conductor strip which has an insulating layer between the conductive strips and an encapsulating insulating sheet is available for use with such printed circuit boards and is particularly advantageously mounted on such boards with integrated circuit packages mounted over the bus. A plurality of tabs for tapping the bus strip extends from the sides of each conductive strip at spaced intervals along the length of the strip. The electrically conductive strips typically are very thin copper ribbon with a thickness of about 0.010 inch and width of less than about 0.3 inch. It has been the practice to order such laminated bus conductors in specific lengths for use in wiring of such printed circuit boards. Attempts to cut the electrical bus conductor to a desired length while wiring the printed circuit board result in a shorting out of the conductive strips. The shorting out typically takes place at the edges of the thin copper strips, with the cutting of thin copper strip producing a burr which punctures the insulation between the copper strips, thereby shorting out the conductors.

SUMMARY OF THE INVENTION

An improved miniaturized longitudinally extending electrical bus conductor is provided which can be cut to a desired length without shorting out the conductive members. The electrical bus conductor comprises first and second thin parallel conductor strips and a thin insulating strip disposed between the conductor strips. In the improved design a plurality of first spaced apertures is provided in a first conductor strip. The first apertures extend across a predetermined portion of the first conductor strip. A plurality of second spaced apertures is provided in the second conductor strip likewise extending across a predetermined portion of the second strip. The first and second apertures are longitudinally aligned and transversely overlapped, with the first and second conductor strips being in non-overlapping relationship across the full width of the bus conductor where the apertures overlap. The electrical bus conductor can then be cut to a desired length by a transverse cut at the aligned, over-lapped apertures without shorting out the conductor strips.

The laminated electrical bus conductors of the present invention can be prepared in a continuous production technique which significantly lowers the cost of preparation of the bus conductor.

DESCRIPTION OF THE PREFERRED EMBODIMENTS

Figure 1:
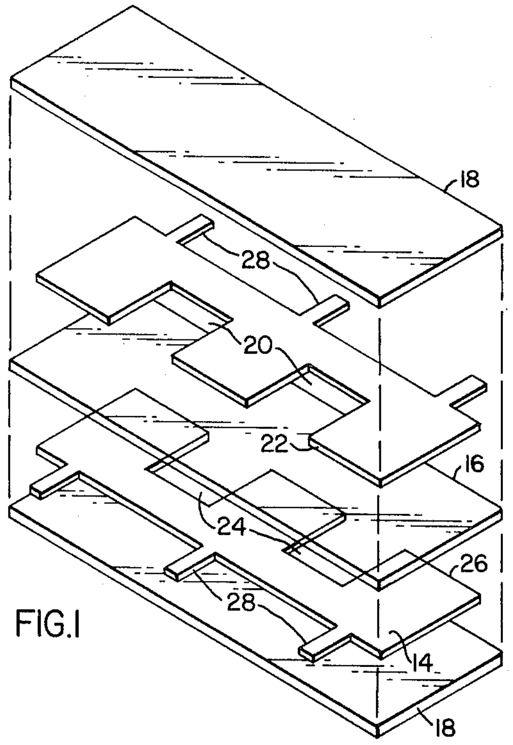
FIG. 1 is an isometric view showing the conductive strips separated prior to their lamination together with an insulating material therebetween.
Figure 2:
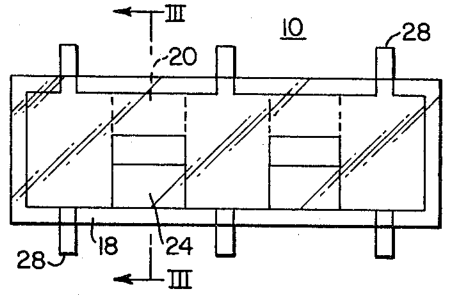
FIG. 2 is a plan view of an assembled miniaturized bus conductor of the present invention.
Figure 3:
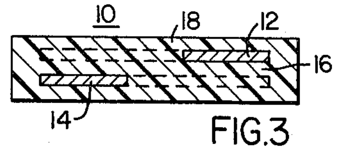
FIG. 3 is a cross-sectional view taken through lines 3—3 of FIG. 2.

The bus conductor 10 is seen in FIGS. 1, 2 and 3. The miniaturized longitudinally extending electrical bus conductor 10 comprises thin parallel first and second conductor strips 12 and 14 respectively. The conductor strips 12 and 14 are separated by an insulating layer or strip 16 disposed therebetween. The conductor strips 12 and 14 are shown in FIG. 1 prior to assembly or lamination of the bus conductor 10 which is more clearly seen in FIGS. 2 and 3. In the assembled bus conductor 10 an encapsulating insulation sheeting 18 is applied about the first and second conductor strips.

A plurality of first spaced apertures 20 is provided in the first conductor strip 12. The first spaced apertures 20 extend transversely from one side edge 22 of the first conductor 12 a distance greater than half the width of the first conductor 12. A plurality of second spaced apertures 24 is provided in the second conductor strip 14, with the second apertures 24 extending transversely from an opposed side edge 26 of the second conductor strip 14 a distance greater than half the width of the second conductor. As is clearly seen in FIGS. 2 and 3, when the conductor strips are laminated together in parallel configuration, the first and second apparatus are partially aligned and partially overlapped, with the first and second conductive strips thus being in non-overlapping relationship across the full width of the bus conductor 10 at the position where the apertures overlap. It can be readily appreciated that if one desires to cut a bus conductor 10 to a desired length, one need merely make a transverse cut across the bus conductor at a point where the apertures overlap and the conductors are in non-overlapping relationship. In cutting the bus conductor in such a fashion there is no danger of a shorting out of the parallel bus conductors since even if some deformation of the conductor such as a burr is produced by the cutting action, there is no contiguous portion of the other conductor strip which can be shorted. This is due to the non-overlapping relationship of the conductor strips across the full width of the bus conductor. The bus conductor 10 has a plurality of tabs or taps 28 which extend from each of the conductor strips and are spaced at desired distances along the length of the bus conductor to permit tapping of the power supply bus. The tabs 28 are bent down and electrically connected to the operational circuit in use.

Figure 4:
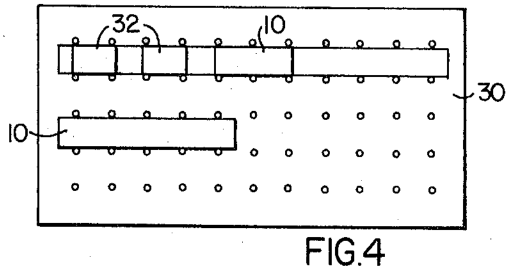
FIG. 4 is a plan view of a printed circuit board on which the bus conductor of the present invention is mounted and wherein integrated circuit packages are mounted over the bus conductor.

The bus conductor 10 of the present invention is seen in FIG. 4 mounted in an operative embodiment on a printed circuit board 30. The bus conductor 10 has been cut to specified length and integrated circuit package components 32 are seen mounted over and connected to the bus conductor 10.

The bus conductor 10 of the present invention will now be described by way of a specific example. The first and second conductor strips 12 and 14 are rolled copper with a thickness of about 0.010 inch and a width of less than about 0.3 inch. The present invention allows the bus conductor to be of continuous length or of any desired long working length which can be cut into the desired wiring size. The insulating dielectric material 16 disposed between the parallel conductor strips is about 0.007 inch thick and the encapsulating layers on the top and bottom of the first and second conductor strips are about the same thickness, so that the total thickness of the laminated bus conductor is maintained at about 0.040 inch. This total thickness is such that the bus conductor when mounted on the printed circuit board 30 can have integrated circuit components mounted over the bus conductor 10. The pin connections from the integrated circuit components are of a sufficient length to be connectable at the connector junctions and no adaptor pins are necessary. The electrical tabs 28 which extend from the sides of the conductor strips and the bus conductor are spaced along the length of the bus conductor at intervals which are a multiple of the spacing between connection stations on the printed circuit board. In this specific example the center lines of the tabs are spaced about 0.90 inch apart. The center lines of the generally rectangular apertures are also spaced about 0.90 inch apart. The first and second apertures or notches extend in a direction transverse to the direction of extension of the bus conductor for about 0.15 inch, and the width in the direction of longitudinal extension of the bus conductor is about 0.10 inch. The first and second apertures which are aligned overlap in the center of the bus conductor by about 0.03 inch.

The bus conductor of the present invention has a high relative capacitance, and a low leakage current rating. In general a relatively low DC voltage is carried on such bus conductors when used in printed circuit board applications.

Figure 5:
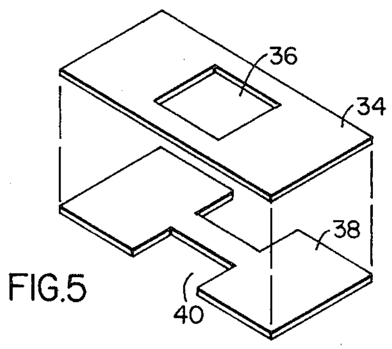
FIG. 5 is similar to FIG. 1 but wherein the shape of the apertures has been changed.

In the preferred embodiment as seen in FIGS. 1, 2, and 3 the first and second apertures extend from one side of each of the conductor strips and overlap in the center portion of the bus conductor. In the embodiment shown in FIG. 5 the aperture configurations are varied but are alignable in overlapping relationship so that the first and second conductive strips are maintained in non-overlapping relationships across the full width of the bus conductor where the apertures overlap. Thus in FIG. 5 the first conductor strip 34 has a plurality of generally rectangular apertures 36 cut symmetrically relative to the center portion of the conductor strip. The second conductor strip 39 has a plurality of opposed second apertures 40 cut in opposed side edges of the second conductor strip 38. The transverse extension of the first generally rectangular aperture is again greater than about one half the width of the first conductor strip 34, and the total transverse extension of the two second apertures 40 is also equal to about greater than half the total width of the second conductor strip. It will be appreciated that when the first conductor strip 34 and second conductor strip 38 are disposed in parallel relationship and laminated with an insulating layer therebetween, with the apertures 36 and 40 being aligned or at least partially aligned and partially overlapping, that the first and second conductive strips will be in non-overlapping relationship across the final width of the bus conductor where the apertures overlap. This will permit the electrical bus conductor to be cut to a desired length at this position of aperture overlap without shorting out the conductor strips.

Figure 6:
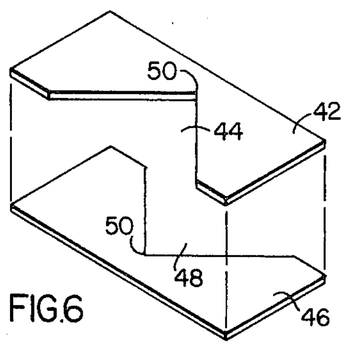
FIG. 6 is yet another embodiment of the invention similar to FIG. 1 wherein the apertures have yet another configuration.

In still another embodiment of the present invention as seen in FIG. 6 a first conductor strip 42 has a plurality of generally triangular apertures 44 spaced along its longitudinal direction of extension. The second conductor strip 46 has a plurality of second triangular apertures 48 spaced along its length. The first triangular apertures 44 and second triangular apertures 48 are disposed so that the apex portion 50 of each extends greater than about half the width of each of the respective conductor strips. The apex portions 50 of the triangular apertures 44 and 48 are readily alignable to provide an overlap of the apex portion of the apertures, so that the first and second conductive strips 42 and 46 respectively are in a non-overlapping relationship across the full width of the bus conductor 10 at the overlapped apertures. Thus the bus conductor can be readily cut across this apex portion without shorting out the conductor strips.

It is apparent that apertures of various configurations can be utilized in practicing the present invention. It is merely necessary that the apertures be aligned and overlapped so that the conductive strips are maintained in a non-overlapping relationship across the full width of the bus conductor.

The provision of the spaced apertures in the conductors does not significantly affect the conductance characteristics of the conductors. This is because the longitudinal extent of the apertures is small compared to the length of the conductor strips.

The parallel conductor strips have been described in the foregoing embodiments as being of the same width and of generally coextensive area, except at the apertures, to maximize self-capacitance of the conductors. It is possible to offset the conductors in the transverse direction while maintaining the parallel relationship, and still practice the invention. If the conductor strips were thus offset, the aperture dimension in the transverse direction need not exceed half the width of the conductor width in order to still provide an aperture overlap and practice the present invention.

It is also apparent that the structure of the present invention permits and suggests a convenient method of producing a continuous bus conductor. Continuous strips of conductive copper can be punched to provide the apertures and the tabs or taps, and thereafter laminated together with an insulating layer between and about the conductor strips to form a continuous length bus conductor which can be for example rolled about a reel. The bus conductor could then be unreeled and cut to length at the desire of the user of the bus conductor.

The bus conductor of the present invention is readily usable in printed circuit board applications with integrated circuit package components mounted over the bus conductor and utilizing standard package pins. The insulated laminated construction of the bus conductor of the present invention and the thin overall structure readily permit crossing of circuitry on the printed circuit boards. In disposing the bus conductor under integrated circuit packages one can optimize the use of the printed circuit board area.

We claim:

1. An elongated continuous electrical bus conductor adapted to be cut into a plurality of segments at overlapping aperture portions intermediate the ends of the bus conductor without deformation which would cause electrical shorting, and comprising first and second conductor strips positioned parallel to one another, and an insulating layer between said first and second conductor strips, each of said first and second conductor strips having at least one aperture portion provided therein intermediate its end points, said at least one aperture portion in said first conductor strip being rectangular and cut symmetrically relative to the transverse center of said first conductor strip with a transverse extension greater than one-half the width of the bus conductor, and said at least one aperture portion in said second conductor strip extending transversely from opposed side edges of said second conductor strip with a transverse extension greater than one-half and less than the width of the bus conductor, said aperture portions being longitudinally aligned and transversely overlapped, with the first and second conductor strips being in non-overlapping relationship across the full width of the bus conductor where the aperture portions overlap, whereby the electrical bus conductor can be cut into segments at the aligned overlapped aperture portions without deformation that would cause the first and second conductor strips to make contact.

2. An elongated continuous electrical bus conductor adapted to be cut into a plurality of segments at overlapping aperture portions intermediate the ends of the bus conductor without deformation which would cause electrical shorting, and comprising first and second conductor strips positioned parallel to one another, and an insulating layer between said first and second conductor strips, each of said first and second conductor strips having at least one aperture portion provided therein intermediate its end points, each of said at least one aperture portions being triangular with the apexes of said triangular aperture portions being disposed to extend from opposed side edges of said first and second conductor strips a distance greater than one-half the width of the bus conductor, said aperture portions being longitudinally aligned and transversely overlapped, with the first and second conductor strips being in non-overlapping relationship across the full width of the bus conductor where the aperture portions overlap, whereby the electrical bus conductor can be cut into segments at the aligned overlapped aperture portions without deformation that would cause the first and second conductor strips to make contact.

3. An elongated continuous electrical bus conductor adapted to be cut into a plurality of segments at overlapping aperture portions without deformation which would cause electrical shorting, and comprising first and second conductor strips positioned parallel to one another, an insulating layer between said first and second strips and encapsulating insulation disposed about said first and second strips, a plurality of tabs extending in longitudinal alignment from opposed side edges of said first and second conductor strips through said encapsulating insulation to permit electrical connection of the bus conductor to electrical components, each of said first and second conductor strips having at least one aperture portion provided therein intermediate its end points, said at least one aperture portion in said first conductor strip being rectangular and cut symmetrically relative to the transverse center of said first conductor strip and extending transversely of said first conductor strip a distance greater than one-half the width of the bus conductor, and said at least one aperture portion in said second conductor strip extending transversely from the opposed side edges of said second conductor strip with a transverse extension greater than one-half and less than the width of the bus conductor, said aperture portions being longitudinally aligned and transversely overlapped, with the first and second conductor strips being in non-overlapping relationship across the full width of the bus conductor where the aperture portions overlap, whereby the electrical bus conductor can be cut into segments at the aligned overlapped aperture portions without deformation that would cause the first and second conductor strips to make contact.

4. An elongated continuous electrical bus conductor adapted to be cut into a plurality of segments at overlapping aperture portions without deformation which would cause electrical shorting, and comprising first and second conductor strips positioned parallel to one another, an insulating layer between said first and second strips and encapsulating insulation disposed about said first and second strips, a plurality of tabs extending in longitudinal alignment from opposed side edges of said first and second conductor strips through said encapsulating insulation to permit electrical connection of the bus conductor to electrical components, each of said first and second conductor strips having at least one aperture portion provided therein intermediate its end points, said at least one aperture portion in said first conductor strip being triangular and extending transversely from one side edge of said first conductor strip with the apex disposed from said side edge of said first conductor strip a distance greater than one-half the width of the bus conductor, and said at least one aperture portion of said second conductor strip being triangular and extending transversely from the opposed side edge of said second conductor strip with the apex disposed from said side edge of said second strip a distance greater than one-half the width of the bus conductor, said aperture portions being longitudinally aligned and transversely overlapped with the first and second conductor strips being in non-overlapping relationship across the full width of the bus conductor where the aperture portions overlap, whereby the electrical bus conductor can be cut into segments at the aligned overlapped aperture portions without deformation that would cause the first and second conductor strips to make contact.

* * * * *